(12) United States Patent
Kanda et al.

(10) Patent No.: US 7,547,950 B2
(45) Date of Patent: Jun. 16, 2009

(54) SEMICONDUCTOR DEVICE AND METHOD OF MANUFACTURING THE SAME

(75) Inventors: Ryo Kanda, Gunma (JP); Iwao Takahashi, Gunma (JP); Yoshinori Sato, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 139 days.

(21) Appl. No.: 11/770,238

(22) Filed: Jun. 28, 2007

(65) Prior Publication Data

US 2008/0001231 A1 Jan. 3, 2008

(30) Foreign Application Priority Data

Jun. 29, 2006 (JP) ............... 2006-179389

(51) Int. Cl.
*H01L 27/088* (2006.01)
(52) U.S. Cl. ...................... 257/401; 438/284
(58) Field of Classification Search ................. 257/401; 438/284
See application file for complete search history.

(56) References Cited

U.S. PATENT DOCUMENTS

| | | | |
|---|---|---|---|
| 5,719,421 A | 2/1998 | Hutter et al. | |
| 5,786,252 A * | 7/1998 | Ludikhuize et al. | 438/275 |
| 6,359,318 B1 * | 3/2002 | Yamamoto et al. | 257/378 |
| 7,247,918 B2 * | 7/2007 | Tateyama | 257/401 |
| 7,279,745 B2 * | 10/2007 | Otake | 257/335 |
| 2006/0076612 A1 | 4/2006 | Otake et al. | |

FOREIGN PATENT DOCUMENTS

| | | |
|---|---|---|
| CN | 1770410 A | 5/2006 |
| JP | 2001-291781 | 10/2001 |

* cited by examiner

*Primary Examiner*—Douglas M Menz
(74) *Attorney, Agent, or Firm*—Fish & Richardson P.C.

(57) ABSTRACT

A conventional semiconductor device has a problem that it is difficult to obtain a desired breakdown voltage characteristic due to a reduction in a punch-through breakdown voltage between drain and source regions. In a semiconductor device according to the present invention, a P type diffusion layer is formed in an N type epitaxial layer. An N type diffusion layer as a back gate region is formed in the P type diffusion layer. The N type diffusion layer is formed by self-alignment using a drain electrode. This structure makes it possible to increase an impurity concentration of the N type diffusion layer in a vicinity of a P type diffusion layer as a source region. As a result, it is possible to improve a punch-through breakdown voltage between the drain and the source regions, and to achieve a desired breakdown voltage characteristic of the MOS transistor.

6 Claims, 11 Drawing Sheets a distance of the Y axis shown in Fig. 2 [$\mu$m]

a distance of the X axis shown in Fig. 2 [$\mu$m]

SEMICONDUCTOR DEVICE AND METHOD OF MANUFACTURING THE SAME

BACKGROUND OF THE INVENTION

Priority is claimed to Japanese Application Number JP2006-179389 filed on Jun. 29, 2006, the disclosure of which is incorporated herein by reference in its entirety.

1. Field of the Invention

The present invention relates to a semiconductor device in which a punch-through breakdown voltage between drain and source regions is improved, and a method of manufacturing the semiconductor device.

2. Description of the Related Art

As an example of a conventional semiconductor device and a conventional method of manufacturing the semiconductor device, the following P-channel MOS transistor has been known. Firstly, a semiconductor substrate containing a P type impurity is prepared. Ions of phosphorus (P) are implanted and thermally diffused in a region where a P-channel MOS transistor is to be formed on the semiconductor substrate. Thereby, an N type well region is formed. Subsequently, ions of phosphorus (P) are implanted into the N type well region at an energy of 80 to 200 (KeV), and thereby an N type diffusion region is formed. By the annealing-heat treatment, the N type diffusion region is formed in a manner that an impurity concentration thereof is $1.0 \times 10^{17}$ to $4.0 \times 10^{17}$ (/cm$^3$) in a region at a depth of about 0.4 to 0.7 (μm). Thereafter, P type diffusion regions as a source region and a drain region are formed in the N type well region, and a gate oxide film and a gate electrode are formed on the semiconductor substrate. The P-channel MOS transistor prevents a reduction in a punch-through breakdown voltage between the drain and source regions by forming the N type diffusion region. This technology is described, for instance, in Japanese Patent Application Laid-open Publication No. 2001-291781 (Pages. 9 to 11, and FIG. 1).

As described above, in the conventional semiconductor device, the N type diffusion region is formed in a deep portion of the N type well region in order to prevent the reduction in the punch-through breakdown voltage between the drain and source regions. In a channel region formed in the N type well region, a fluctuation in the impurity concentration is likely to occur due to the influence at the time of forming the N type diffusion region, and thereby there is a problem in this structure that an appropriate threshold voltage (Vth) of the MOS transistor changes. Furthermore, there is another problem that it is difficult to reduce the threshold voltage and on-resistance of is another problem that it is difficult to reduce the threshold voltage and on-resistance of the MOS transistor in a case where the impurity concentration of the channel region is increased due to the fluctuation in the impurity concentration in the channel region of the MOS transistor.

Moreover, in the conventional method of manufacturing a semiconductor device, after the N type well region is formed in the region where the P-channel MOS transistor is formed on the semiconductor substrate, the N type diffusion region is formed. Then, there is a case where the N type diffusion region is formed apart from a desired region with respect to the source and drain regions due to mask misalignment at the time of forming the N type diffusion region, or at the time of forming the source and drain regions. In this manufacturing method, there is a problem that the punch-through breakdown voltage between the drain and source regions is reduced, and thereby the breakdown voltage characteristic of the MOS transistor is deteriorated.

Furthermore, in the conventional method of manufacturing a semiconductor device, after the N type well region is formed in the region where the P-channel MOS transistor is formed on the semiconductor substrate, the N type diffusion region is formed. There is a problem in this manufacturing method that it is difficult to reduce the size of the MOS transistor, since it is necessary to take account of degrees of mask misalignment at the time of forming the N type diffusion region, the source and drain regions.

In addition, in the conventional method of manufacturing a semiconductor device, after the N type well region is formed in the region where the P-channel MOS transistor is formed on the semiconductor substrate, the N type diffusion region is formed. There is a problem in this manufacturing method that the number of manufacturing steps and the number of masks increase, and thereby it is difficult to reduce the manufacturing cost.

SUMMARY OF THE INVENTION

The present invention has been made in consideration of the above-described circumstances. A semiconductor device according to the present invention includes as follows. Specifically, the semiconductor device includes a semiconductor layer, a drain region, a source region and a back gate region, which are formed in the semiconductor layer, a gate oxide film formed on the semiconductor layer, and a gate electrode formed on the gate oxide film. In the semiconductor device, a first diffusion layer of one conductivity type is formed in the semiconductor layer so as to extend across regions where the drain region and the back gate region are formed, that a diffusion layer of an opposite conductivity type constituting the back gate region is formed in the first diffusion layer of the one conductivity type, that a second diffusion layer of the one conductivity type constituting the source region is formed in the diffusion layer of the opposite conductivity type, and that an impurity concentration peak of the diffusion layer of the opposite conductivity type is formed in a deeper portion of the first diffusion layer of the one conductivity type than a junction region between the diffusion layer of the opposite conductivity type and the second diffusion layer of the one conductivity type. Accordingly, in the semiconductor device according to the present invention, an impurity concentration of the back gate region positioned in a vicinity of the deep portion of the source region can be increased by forming the impurity concentration peak of the back gate region in the deep portion of the semiconductor layer. This structure makes it possible to improve a punch-through breakdown voltage between the drain and source regions.

In addition, the semiconductor device according to the present invention includes that an impurity concentration in a vicinity of a bottom surface of the second diffusion layer of the one conductivity type is 0.8 times or more as high as that in a vicinity of a top surface of the second diffusion layer of the one conductivity type among impurity concentrations of the diffusion layer of the opposite conductivity type in a vicinity of the junction region. Accordingly, in the semiconductor device according to the present invention, an appropriate threshold voltage of the MOS transistor is achieved, while the impurity concentration peak of the back gate region is formed in the deep portion of the semiconductor layer. This structure makes it possible to improve a punch-through breakdown voltage between the drain and source regions, and to reduce the threshold voltage.

Moreover, the semiconductor device according to the present invention includes that the gate electrode is formed of a polysilicon film and a tungsten silicon film, and that the tungsten silicon film has a thickness greater than that of the polysilicon film. Accordingly, in the semiconductor device of the present invention, the diffusion layer as the back gate region is formed in a desired region by using the tungsten silicon film in the gate electrode. This structure makes it possible to reduce the device size, and to reduce the on-resistance of the MOS transistor.

In addition, the method of manufacturing a semiconductor device according to the present invention includes as follows. Specifically, the manufacturing method includes the steps of: forming a first diffusion layer of one conductivity type in a semiconductor layer, and forming a gate oxide film and a gate electrode on the semiconductor layer, and then forming a diffusion layer of an opposite conductivity type constituting a back gate region in the first diffusion layer of the one conductivity type by self-alignment using the gate electrode, and forming a second diffusion layer of the one conductivity type constituting a source region in the diffusion layer of the opposite conductivity type in a manner that the second diffusion layer of the one conductivity type overlapping the diffusion layer of the opposite conductivity type, and forming a third diffusion layer of the one conductivity type constituting a drain region in the first diffusion layer of the one conductivity type. In the step of forming the diffusion layer of the opposite conductivity type, an impurity concentration peak of the diffusion layer of the opposite conductivity type is formed in a deeper portion of the first diffusion layer of the one conductivity type than a junction region between the diffusion layer of the opposite conductivity type and the second diffusion layer of the one conductivity type. Accordingly, in the manufacturing method according to the present invention, the back gate region is formed into the deep portion of the semiconductor layer by self-alignment using the gate electrode. This manufacturing method makes it possible to increase the impurity concentration of the back gate region in a vicinity of the deep portion of the source region. Then, this manufacturing method makes it possible to improve a punch-through breakdown voltage between the drain and source regions in the MOS transistor.

Moreover, the method of manufacturing a semiconductor device according to the present invention includes that the step of forming the diffusion layer of the opposite conductivity type includes the step of performing ion implantation at an accelerating voltage of 80 to 160 (KeV). Accordingly, in the manufacturing method according to the present invention, the back gate region is formed into the deep portion of the semiconductor layer by self-alignment using the gate electrode. This manufacturing method makes it possible to increase an impurity concentration of the back gate region positioned in the vicinity of the deep portion of the source region.

Furthermore, the method of manufacturing a semiconductor device according to the present invention includes that, in the step of forming the gate electrode, a tungsten silicon film is deposited on a polysilicon film in a manner that the tungsten silicon film has a thickness greater than that of the polysilicon film. Accordingly, in the manufacturing method according to the present invention, the gate electrode is formed by using the tungsten silicon film. This manufacturing method makes it possible to form the back gate region in the deep portion of the semiconductor layer by self-alignment using the gate electrode.

DETAILED DESCRIPTION OF THE PREFERRED EMBODIMENTS

Figure 1:
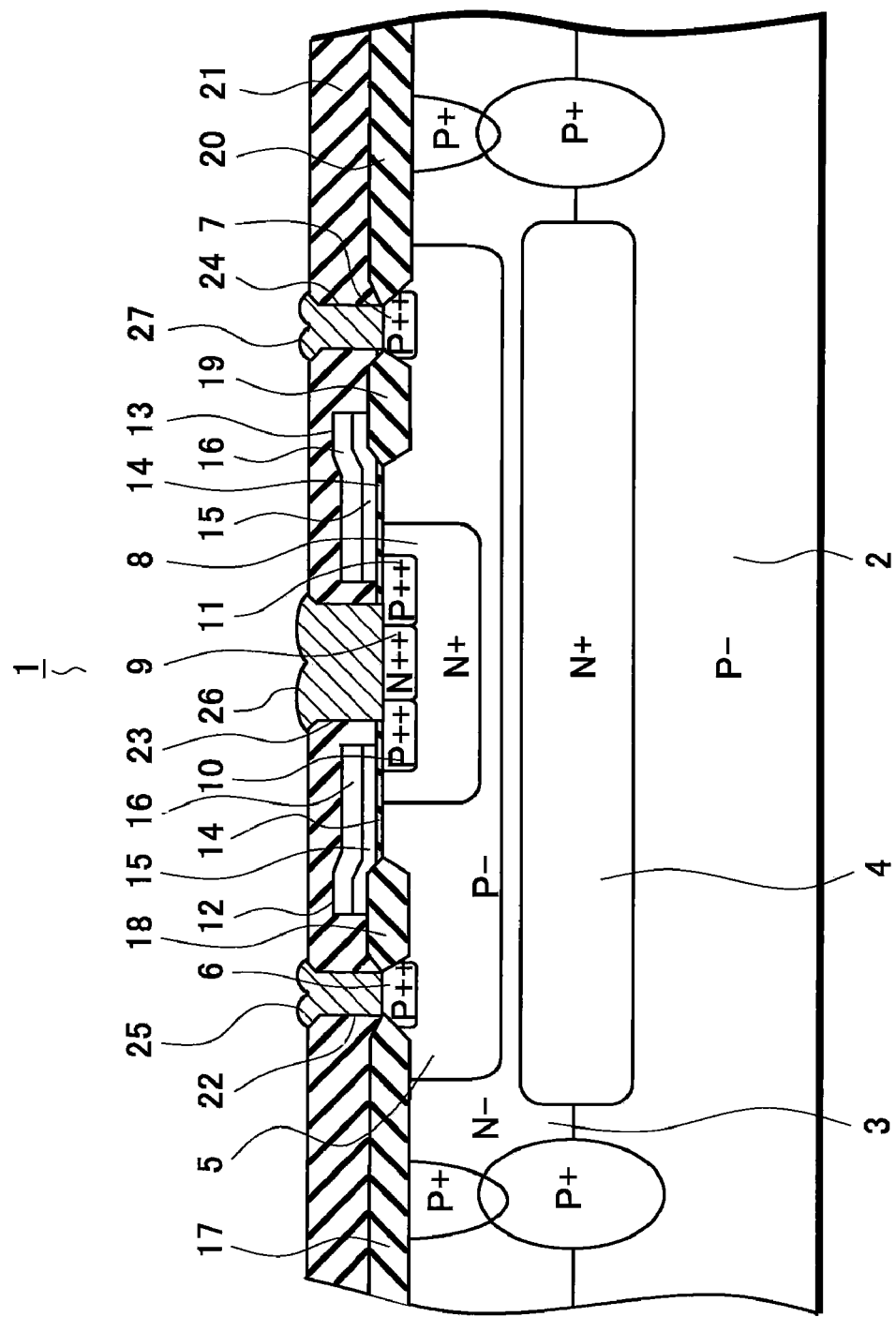
FIG. 1 is a cross-sectional view for describing a semiconductor device according to a preferred embodiment of the present invention.
Figure 2:
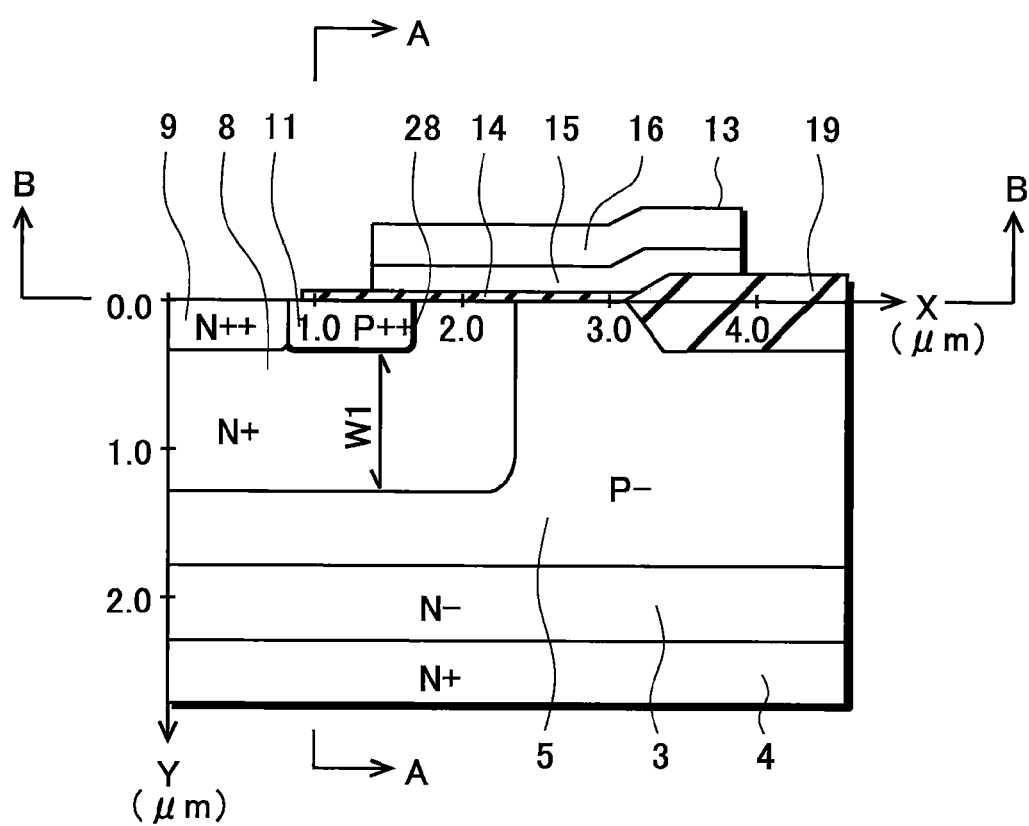
FIG. 2 is a cross-sectional view for describing the semiconductor device according to this preferred embodiment of the present invention.
Figure 3A:
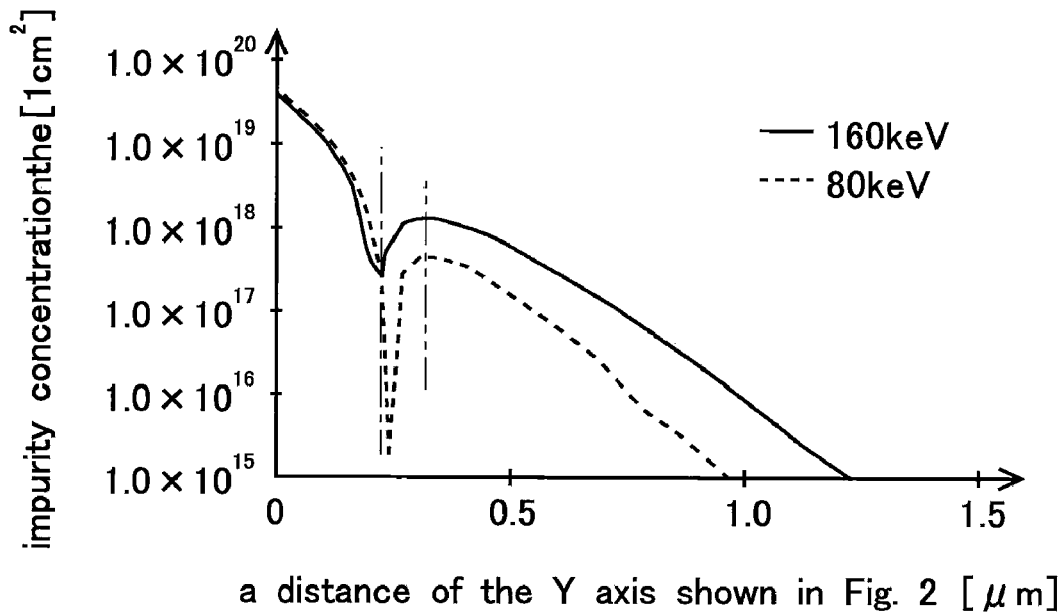
FIG. 3A shows impurity concentration profiles and FIG. 3B shows other impurity concentration profiles for describing the semiconductor device according to this preferred embodiment of the present invention.
Figure 3B:
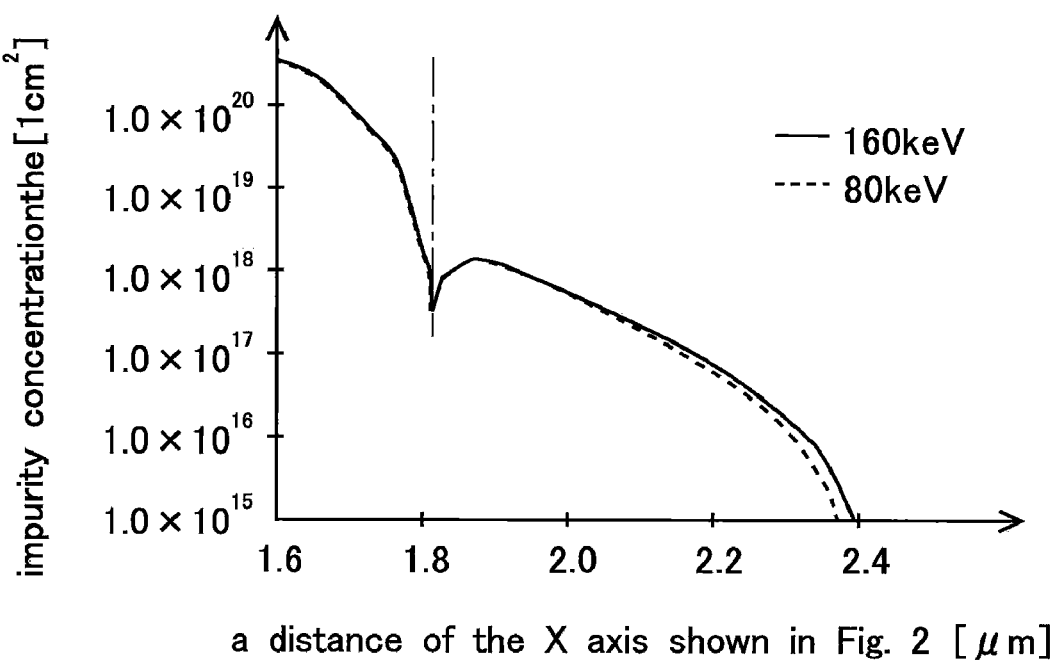
Figure 4A:
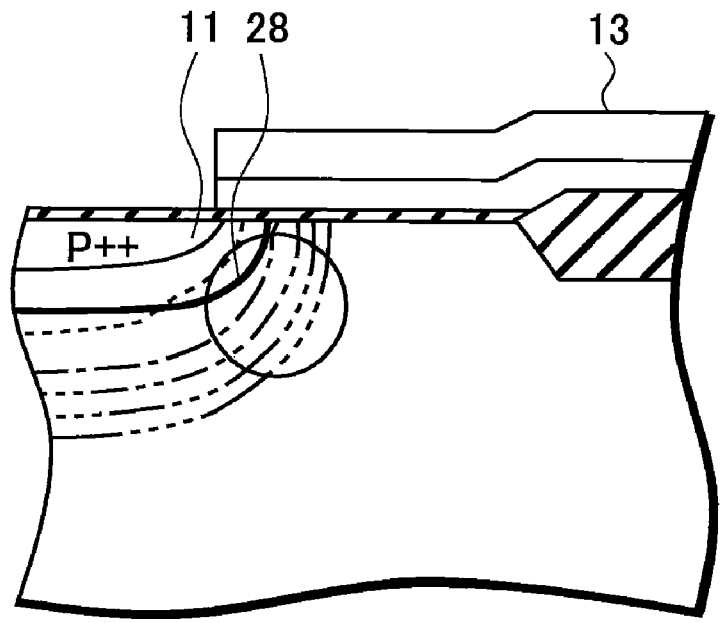
FIG. 4A shows impurity concentration gradients and FIG. 4B shows other impurity concentration gradients for describing the semiconductor device according to this preferred embodiment of the present invention.
Figure 4B:
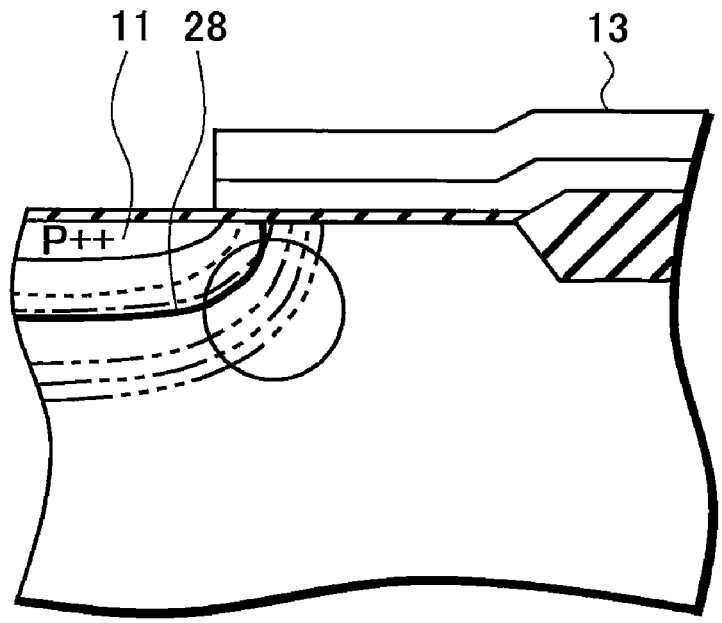

Hereinafter, descriptions will be given in detail of a semiconductor device according to a preferred embodiment of the present invention with reference to FIGS. 1 to 4. FIG. 1 is a cross-sectional view for describing the semiconductor device according to this embodiment. FIG. 2 is a cross-sectional view for describing the semiconductor device according to this embodiment. FIG. 3A and FIG. 3B show impurity concentration profiles for describing the semiconductor device according to this embodiment. FIG. 4A and FIG. 4B are drawings for describing impurity concentration gradients for describing the semiconductor device according to this embodiment As shown in FIG. 1, a P-channel MOS transistor 1 mainly includes a P type single crystal silicon substrate 2, an N type epitaxial layer 3, an N type buried diffusion layer 4, a P type diffusion layer 5, P type diffusion layers 6 and 7, which are used as drain regions, N type diffusion layers 8 and 9, which are used as back gate regions, P type diffusion layers 10 and 11, which are used as source regions, and gate electrodes 12 and 13.

The N type epitaxial layer 3 is formed on the P type single crystal silicon substrate 2. Note that, although only one epitaxial layer 3 is formed on the substrate 2 in this embodiment, the preferred embodiment of the present invention is not limited to this case. For example, a plurality of epitaxial layers can be stacked on the substrate.

The N type buried diffusion layer 4 is formed so as to extend in both regions of the substrate 2 and the epitaxial layer 3. As illustrated in FIG. 1, the N type buried diffusion layer 4 is formed across a region where the P-channel MOS transistor 1 is formed.

The P type diffusion layer 5 is formed in the epitaxial layer 3. The P type diffusion layer 5 is formed across a region where the P-channel MOS transistor 1 is formed.

The P type diffusion layers 6 and 7 are formed in a manner of overlapping the P type diffusion layer 5. By this structure, the P type diffusion layers 6 and 7 are used as drain regions. Note that the P type diffusion layers 6 and 7 may be circularly formed around the N type diffusion layer 8.

The N type diffusion layer 8 is formed in the P type diffusion layer 5 in a manner of overlapping the P type diffusion layer 5. The N type diffusion layer 9 is formed in the N type diffusion layer 8 in a manner of overlapping the N type diffusion layer 8. The N type diffusion layer 8 is used as the back gate region. The N type diffusion layer 9 is used as a back gate leading region. In addition, the N type diffusion layer 8 positioned below the gate electrodes 12 and 13 is used as a channel region.

The P type diffusion layers 10 and 11 are formed in the N type diffusion layer 8 in a manner of overlapping the N type diffusion layer 8. The P type diffusion layers 10 and 11 are used as the source regions. The N type diffusion layer 9 and the P type diffusion layers 10 and 11 are connected to a source electrode 26, and are equal in electric potential to that of the source electrode 26. Incidentally, the P type diffusion layers 10 and 11 may be circularly formed around the N type diffusion layer 9.

The gate electrodes 12 and 13 are formed on a gate oxide film 14. Each of the gate electrodes 12 and 13 is formed of, for example, a polysilicon film 15 and a tungsten silicon film 16 so as to have a desired thickness. Incidentally, the gate electrodes 12 and 13 may be circularly formed.

LOCOS (Local Oxidation of Silicon) oxide films 17, 18, 19 and 20 are formed in the epitaxial layer 3 by means of a LOCOS method. The thickness of each flat portion of the LOCOS oxide films 17, 18, 19 and 20 is approximately 3000 Å to 4000 Å, for example.

An insulating layer 21 is formed over the epitaxial layer 3. The insulating layer 21 is formed of a BPSG (Boron Phospho Silicate Glass) film, a SOG (Spin On Glass) film or the like. In addition, by means of a known photolithography technique, contact holes 22, 23 and 24 are formed in the insulating layer 21 by dry etching using $CHF_3$ or $CF_4$ gas, for example.

In each of the contact holes 22, 23 and 24, an aluminum alloy film made of, for example, an Al—Si film, an Al—Si—Cu film or an Al—Cu film is selectively formed, so that drain electrodes 25 and 27, and the source electrode 26 are formed respectively in the contact holes 22, 24 and 23. Incidentally, the drain electrodes 25 and 27 may be circularly formed around the source electrode 26. In addition, although a layer of wiring to the gate electrodes 12 and 13 is not illustrated in the cross-section shown in FIG. 1, the gate electrodes 12 and 13 are connected to the wiring layer in other regions.

Next, descriptions will be given of a structure of the back gate region in the MOS transistor 1 and characteristics of the MOS transistor 1 with reference to the FIGS. 2 to 4. Note that the X axis shown in FIG. 2 indicates the distance (μm) apart from the N type diffusion layer 9 to the LOCOS oxide film 19. Meanwhile, the Y axis indicates the distance (μm) apart from a surface to a deep portion of the epitaxial layer 3. FIG. 3A shows impurity concentration profiles in a direction of the line A-A in the cross-sectional view shown in FIG. 2. FIG. 3B shows other impurity concentration profiles in a direction of the line B-B in the cross-sectional view shown in FIG. 2. Moreover, the impurity concentration profiles in the direction of the line B-B are of a region in a vicinity of the surface of the epitaxial layer 3. In addition, FIG. 4A shows impurity concentration gradients of the N type diffusion layer 8 in a case where an accelerating voltage is applied at 160 (KeV) at the time of forming the N type diffusion layer 8. FIG. 4B shows other impurity concentration gradients of the N type diffusion layer 8 in a case where an accelerating voltage is applied at 80 (KeV) at the time of forming the N type diffusion layer 8.

As shown in FIG. 2, the P type diffusion layer 5 is formed in the N type epitaxial layer 3 of the MOS transistor 1. The N type diffusion layer 8, which is used as the back gate region, is formed in the P type diffusion layer 5. The P type diffusion layer 11, which is used as the source region, is formed in the N type diffusion layer 8. The N type diffusion layer 8 and P type diffusion layer 11 form a PN junction region 28 therebetween as shown by a thick line. The P type diffusion layer 11 expands to approximately 0.3 to 0.4 (μm) from the surface of the N type epitaxial layer 3. The N type diffusion layer 8 expands to approximately 1.2 to 1.4 (μm) from the surface of the N type epitaxial layer 3.

In FIG. 3A, a solid line indicates the impurity concentration profile in a case where an accelerating voltage is applied at 160 (KeV) at the time of forming the N type diffusion layer 8. Meanwhile, a dotted line indicates the impurity concentration profile in a case where an accelerating voltage is applied at 80 (KeV) at the time of forming the N type diffusion layer 8.

The PN junction region 28 (see FIG. 2) is formed in a region (a region where the solid line intersects a dashed line) approximately 0.2 to 0.3 (μm) apart from the surface of the epitaxial layer 3 (see FIG. 2).

Specifically, in the structure shown by the solid line, a valley-shaped region of the impurity concentration profile, where the solid line intersects the dashed line, is the PN junction region 28. The valley-shape is formed because, in the PN junction region 28, a P type impurity concentration and an N type impurity concentration are compensated each other, and thereby a low impurity concentration region is formed. Then, a region on the left side of the PN junction region 28 in FIG. 3A corresponds to a region where the N type diffusion layer 8 (see FIG. 2) and the P type diffusion layer 11 (see FIG. 2) are formed as overlapped with each other, and thus this region functions as the P type diffusion layer 11. Meanwhile, a region on the right side of the PN junction region 28 corresponds to a region which functions as the N type diffusion layer 8. In other words, the region on the right side of the PN junction region 28 indicates the impurity concentration profile of the N type diffusion layer 8. As shown by a chain double-dashed line, an impurity concentration peak of the N type diffusion layer 8 is formed deeper than the PN junction region 28. The impurity concentration in a vicinity of the PN junction region 28 on the N type diffusion region 8 side is approximately $9.69 \times 10^{17}$ (/cm$^2$).

On the other hand, in the structure shown by the dotted line, a valley-shaped region of the impurity concentration profile (a region on the side of the chain double-dashed line but slightly on the dashed line side) is the PN junction region 28 in common with the structure shown by the solid line. A region on the right side of the PN junction region 28 in FIG. 3A corresponds to a region which functions as the N type diffusion layer 8. In addition, a region where an impurity concentration peak of the N type diffusion layer 8 is formed in a region where the dotted line intersects the chain double-dashed line. The impurity concentration is approximately $4.44 \times 10^{17}$ (/cm$^2$).

Note that, although explained in a method of manufacturing a semiconductor device in detail later, the difference in the impurity concentrations is caused as follows. In the structure shown by the solid line, ion implantation can be performed at a highly accelerating voltage by using the tungsten silicon film 16 in the gate electrode 13. As a result, it is possible to form the impurity concentration peak in the deep portion of the epitaxial layer 3.

In FIG. 3B, a solid line indicates the impurity concentration profile in a case where an accelerating voltage is applied at 160 (KeV) at the time of forming the N type diffusion layer 8. Meanwhile, a dotted line indicates the impurity concentration profile in a case where an accelerating voltage is applied at 80 (KeV) at the time of forming the N type diffusion layer 8.

In the case of the solid line, the PN junction region 28 (see FIG. 2) is formed in a region (a region where the solid line intersects a dashed line) approximately 1.6 (μm) apart from a reference point of the N type diffusion layer 9 (see FIG. 2).

Specifically, in the structure shown by the solid line, a valley-shaped region of the impurity concentration profile, where the solid line intersects the dashed line, is the PN junction region 28. The valley-shape is formed because, in the PN junction region 28, the P type impurity concentration and the N type impurity concentration are compensated each other, and thereby a low impurity concentration region is formed. Then, a region on the left side of the PN junction region 28 in FIG. 3B corresponds to a region where the N type diffusion layer 8 (see FIG. 2) and the P type diffusion layer 11 (see FIG. 2) are formed as overlapped with each other, and thus this region functions as the P type diffusion layer 11. Meanwhile, a region on the right side of the PN junction region 28 in FIG. 3B corresponds to a region which functions as the N type diffusion layer 8. In other words, the region on the right side of the PN junction region 28 in FIG. 3B indicates the impurity concentration profile of the N type diffusion layer 8. As illustrated, the impurity concentration of the N type diffusion layer 8 in the channel region is approximately $1.00 \times 10^{18}$ (/cm$^2$) in order to achieve the appropriate threshold voltage (Vth) of the MOS transistor 1.

On the other hand, in the structure shown by the dotted line, a valley-shaped region of the impurity concentration profile, where the dotted line intersects the dashed is the PN junction region 28 in common with the structure shown by the solid line. The region on the right side of the PN junction region 28 in FIG. 3B corresponds to a region which functions as the N type diffusion layer 8. As illustrated, the impurity concentration of the N type diffusion layer 8 in the channel region is approximately $1.00 \times 10^{18}$ (/cm$^2$) in order to achieve the appropriate threshold voltage (Vth) of the MOS transistor 1.

Each of FIG. 4A and FIG. 4B indicates impurity concentration lines by use of a solid line, a dotted line, a dashed line, a chain double-dashed line, a chain triple-dashed line and a chain quadruple-dashed line. The solid line indicates the highest impurity concentration, and the chain quadruple-dashed line indicates the lowest impurity concentration. Thus, the concentration gradient of the N type diffusion layer 9 is illustrated. Incidentally, in any of FIG. 4A and FIG. 4B, the dashed line indicates the impurity concentration line of $1.0 \times 10^{18}$ (/cm$^2$). Moreover, a region shown by a circle indicates a region where a punch-through is likely to occur between the drain and source regions in the MOS transistor 1.

As shown in FIG. 4A, in a case where an accelerating voltage is applied at 160 (KeV) at the time of forming the N type diffusion layer 8, the impurity concentration region of $1.0 \times 10^{18}$ (/cm$^2$) as shown by the dashed line is disposed to the N type diffusion layer 9 side of the PN junction region 28 in the region shown by the circle. Meanwhile, as shown in FIG. 4B, in a case where an accelerating voltage is applied at 80 (KeV) at the time of forming the N type diffusion layer 8, the impurity concentration region of $1.0 \times 10^{18}$ (/cm$^2$) as shown by the dashed line is disposed to the inner side, i.e. the P type diffusion layer 11 side, of the PN junction region 28 in the region shown by the circle. Thus, when the N type diffusion region is formed at a highly accelerating voltage, it is possible to increase an impurity concentration in a region where a punch-through is likely to occur.

As described above, when the N type diffusion layer 8 is formed, ions are implanted and diffused to cause the N type diffusion layer 8 to have the impurity concentration peak in the deep portion of the N type epitaxial layer 3. Specifically, in FIG. 4A, the impurity concentration line of $1.0 \times 10^{18}$ (/cm$^2$) as shown by the dashed line is formed deeper than the PN junction region 28. Thereby, the impurity concentration of the N type diffusion layer 8 in the deep portion of N type epitaxial layer 3 can be increased, and also the impurity concentration in the channel region can be set to a desired value. In other words, as shown in FIG. 4A and FIG. 4B, by forming the N type diffusion layer 8 at a highly accelerating voltage, the MOS transistor 1 has the structure in which the punch-through is unlikely to occur between the drain and source regions. As a result, it is possible to improve a punch-through breakdown voltage of the MOS transistor 1, while reducing the threshold voltage and on-resistance of the MOS transistor 1. For example, in a case where an accelerating voltage is applied at 160 (KeV) at the time of forming the N type diffusion layer 8, it is possible to reduce the threshold voltage by approximately 0.3 (V), and to reduce the on-resistance by approximately 1.7(%), as compared to the case of an accelerating voltage at 80 (KeV).

Moreover, as illustrated, in order to achieve the appropriate threshold voltage (Vth) of the MOS transistor 1, conditions for forming the N type diffusion layer 8, for example, an impurity concentration profile, diffusion depth, and the like, are designed. As a result, as shown in FIG. 4A and FIG. 4B, even in a case where the accelerating voltages are changed at the time of forming the N type diffusion layer 8, the impurity concentration profiles of the N type diffusion layer 8 in the channel region is substantially equal.

In other words, the impurity concentration profile of the N type diffusion layer 8 is designed to improve the punch-through breakdown voltage between the drain and source regions in the MOS transistor 1. Thereby, impurity concentration ratios (the line A-A direction/the line B-B direction) in the vicinity of the PN junction region 28 on the N type diffusion region 8 side are approximately 0.96 in the case of the solid line, and approximately 0.44 in the case of the dotted line. In this embodiment, the N type diffusion layer 8 is formed so that the impurity concentration ratio becomes larger than 0.8 or more. Thus, it is possible to improve the punch-through breakdown voltage between the drain and source regions in the MOS transistor 1, and to improve a breakdown voltage characteristic of the MOS transistor 1.

Note that, in this embodiment, the descriptions have been given of the case of the lamination structure where the gate electrodes 12 and 13 are formed of the polysilicon film 15 and the tungsten silicon film 16, but the preferred embodiment of the present invention is not limited to the above-described case. For example, a single-layer structure of the polysilicon film or the tungsten silicon film may be employed, as long as the gate electrode 12 or 13 have a thickness enough to prevent the impurity from penetrating therethrough in the step of performing ion implantation to form the N type diffusion layer 8. Moreover, various modifications are possible to be made on the preferred embodiment of the present invention without departing from the spirit of the preferred embodiment of the present invention.

Next, descriptions will be given in detail of a method of manufacturing a semiconductor device according to another preferred embodiment of the present invention with reference to FIGS. 5 to 11. FIGS. 5 to 11 are cross-sectional views for describing the method of manufacturing a semiconductor device according to this embodiment. Incidentally, in FIGS. 5 to 11, descriptions will be given of the method of manufacturing the semiconductor device shown in FIG. 1.

Figure 5:
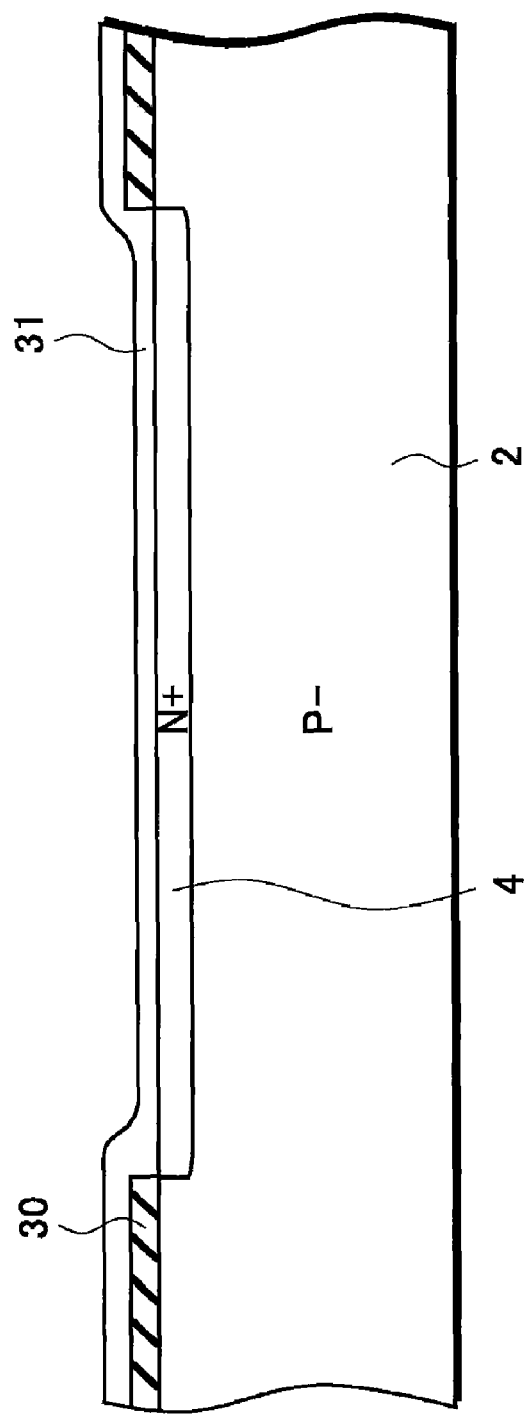
FIG. 5 is a cross-sectional view for describing a method of manufacturing a semiconductor device according to another preferred embodiment of the present invention.

Firstly, as shown in FIG. 5, a P type single crystal silicon substrate 2 is prepared. A silicon oxide film 30 is formed on the substrate 2, and the silicon oxide film 30 is selectively removed, so that an opening is formed in a region where an N type buried diffusion layer 4 is to be formed. Then, by using the silicon oxide film 30 as a mask, a liquid source 31 containing an N type impurity, for example, antimony (Sb) is applied to the surface of the substrate 2 by means of a spin-coating method. Subsequently, the antimony (Sb) is thermally diffused, so that the N type buried diffusion layer 4 is formed. Thereafter, the silicon oxide film 30 and the liquid source 31 are removed.

Figure 6:
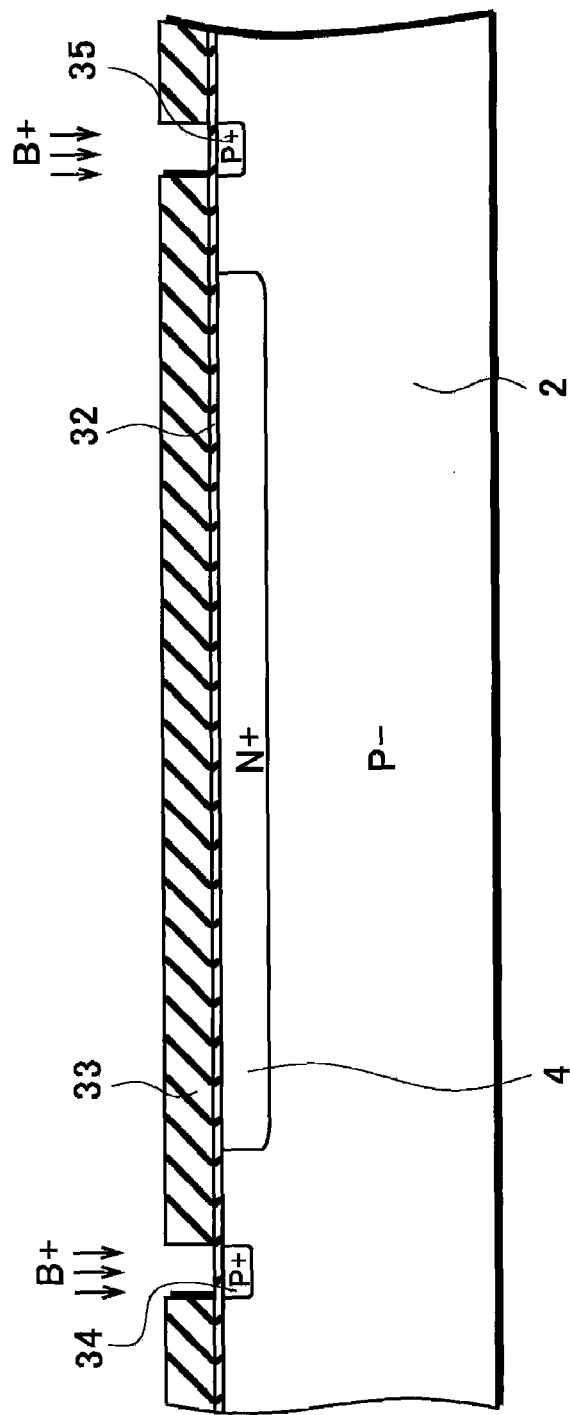
FIG. 6 is a cross-sectional view for describing the method of manufacturing the semiconductor device according to this preferred embodiment of the present invention.

Next, as shown in FIG. 6, a silicon oxide film 32 is formed on the substrate 2, and a photoresist 33 is formed on the silicon oxide film 32. Thereafter, by means of the known photolithography technique, openings are formed in the photoresist 33 on regions where P type buried diffusion layers 34 and 35 are to be formed. Subsequently, ions of a P type impurity, for example, boron (B) are implanted from the surface of the substrate 2 at an accelerating voltage of 40 to 180 (keV) and a dose of $1.0 \times 10^{13}$ to $1.0 \times 10^{16}$ (/cm$^2$). The photoresist 33 is removed, and then the P type buried diffusion layers 34 and 35 are formed by thermal diffusion. After that, the silicon oxide film 32 is removed.

Figure 7:
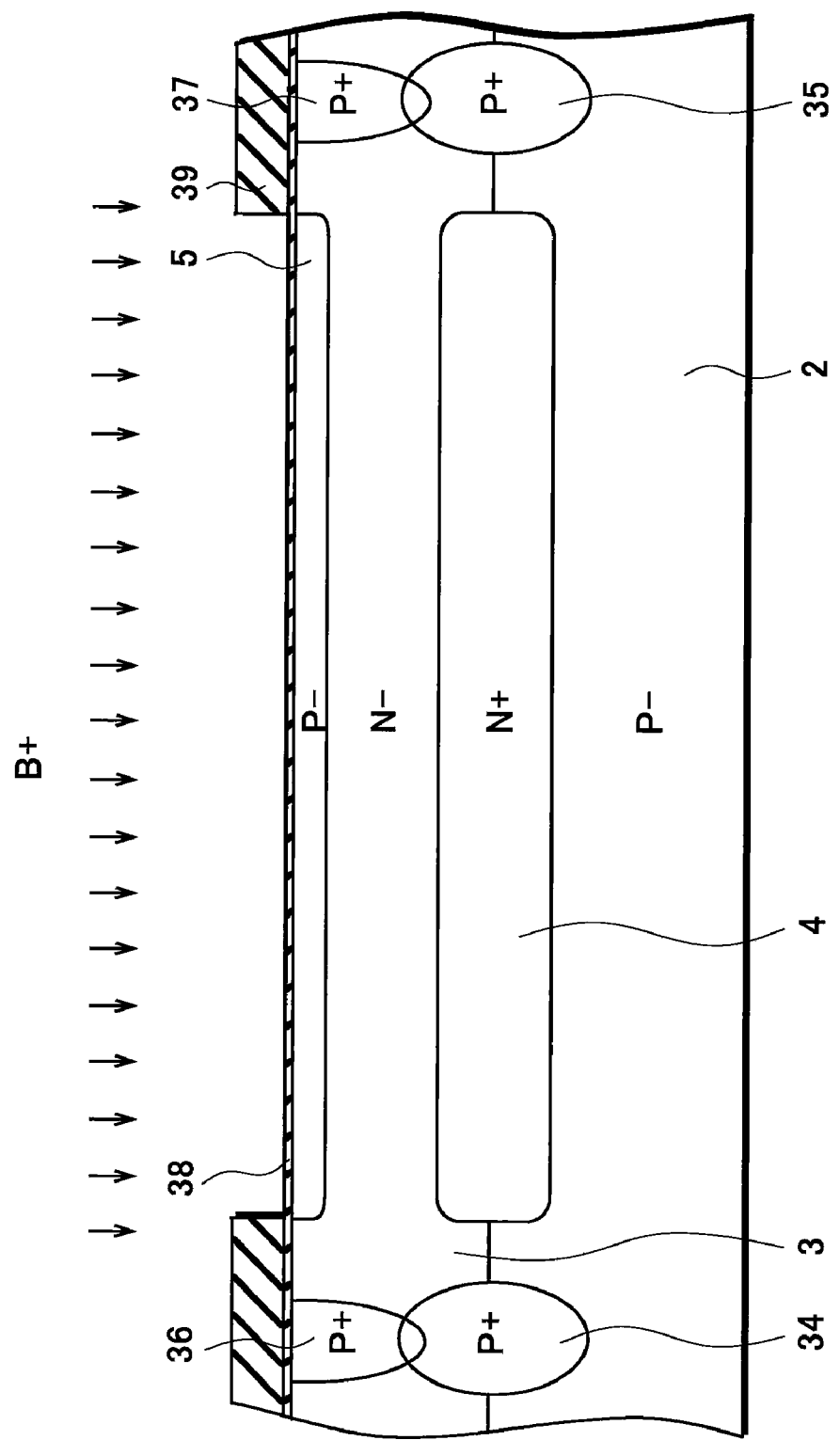
FIG. 7 is a cross-sectional view for describing the method of manufacturing a semiconductor device according to this preferred embodiment of the present invention.

Next, as shown in FIG. 7, the substrate 2 is placed on a susceptor of a vapor phase epitaxial growth apparatus so as to form an N type epitaxial layer 3 on the substrate 2. The vapor phase epitaxial growth apparatus mainly includes a gas supply system, a reactor, an exhaust system and a control system. In this embodiment, by use of a vertical reactor, the thickness uniformity of the epitaxial layer can be improved. The N type impurity in the N type buried diffusion layer 4 and the P type impurities in the P type buried diffusion layers 34 and 35 are thermally diffused by heat treatment in the process of forming the epitaxial layer 3.

Next, by means of the known photolithography technique, P type diffusion layers 36 and 37 are formed in the epitaxial layer 3. Then, a silicon oxide film 38 is formed on the epitaxial layer 3, and a photoresist 39 is formed on the silicon oxide film 38. Thereafter, by means of the known photolithography technique, an opening is formed in the photoresist 39 on a region where a P type diffusion layer 5 is to be formed. Subsequently, ions of a P type impurity, for example, boron (B) are implanted from the surface of the epitaxial layer 3 at an accelerating voltage 40 to 180 (keV) and a dose of $1.0 \times 10^{13}$ to $1.0 \times 10^{16}$ (/cm$^2$). The photoresist 39 is removed, and then the P type diffusion layer 5 is formed by thermal diffusion. After that, the silicon oxide film 38 is removed.

Figure 8:
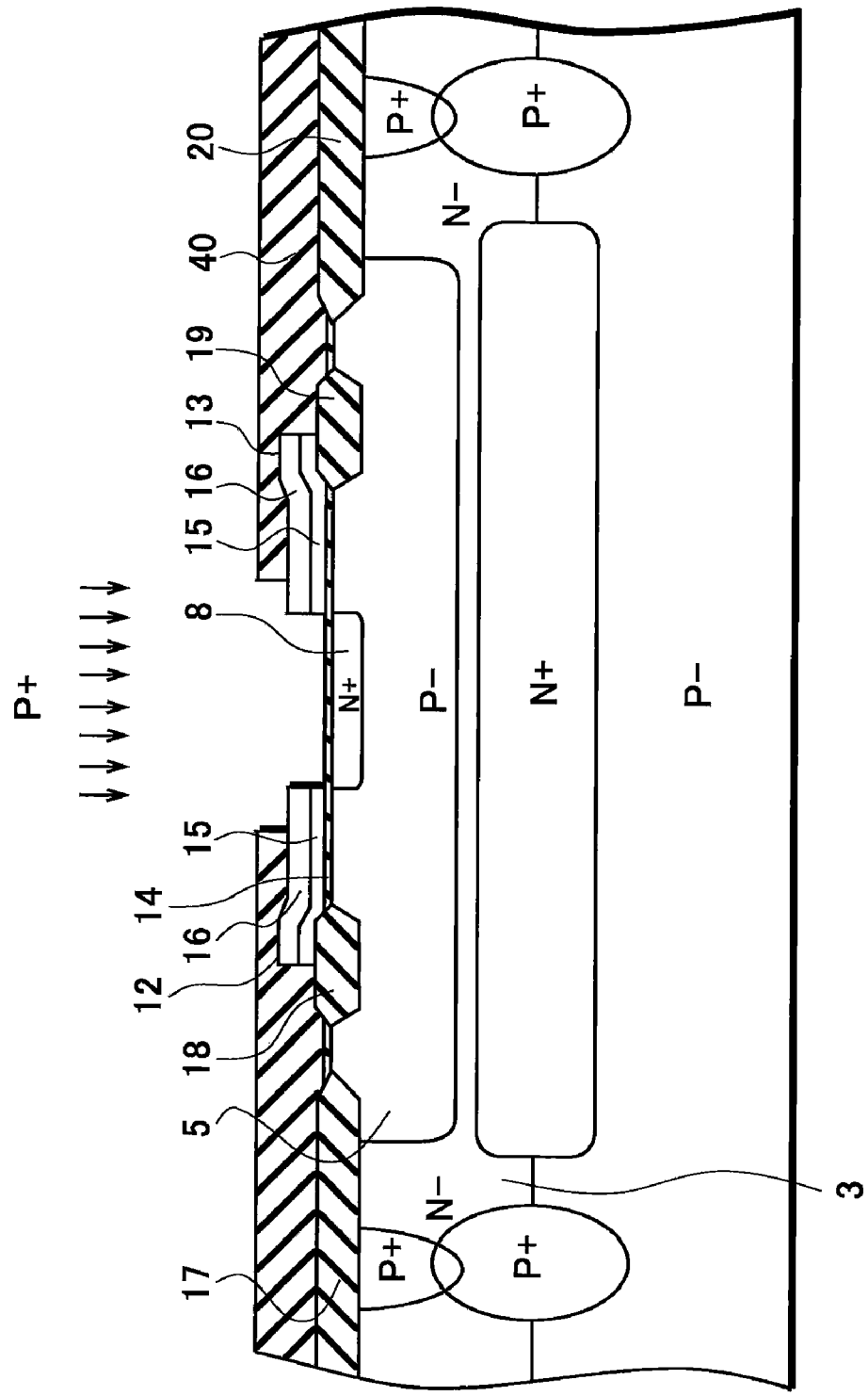
FIG. 8 is a cross-sectional view for describing the method of manufacturing a semiconductor device according to this preferred embodiment of the present invention.

Next, as shown in FIG. 8, LOCOS oxide films 17, 18, 19 and 20 are formed respectively in desired regions of the epitaxial layer 3. A silicon oxide film to be used as a gate oxide film 14 is formed on the epitaxial layer 3 so as to have a thickness of, for example, approximately 100 to 200 (Å). A polysilicon film 15 is formed on the silicon oxide film so as to have a thickness of, for example, approximately 1000 to 2000 (Å), and then a tungsten silicon film 16 is formed on the polysilicon film 15 so as to have a thickness of, for example, approximately 2000 to 3000 (Å). Thereafter, by means of the known photolithography technique, the polysilicon film 15 and the tungsten silicon film 16 are selectively removed to form gate electrodes 12 and 13.

Next, a photoresist 40 is formed on the silicon oxide film to be used as the gate oxide film 14. By means of the known photolithography technique, an opening is formed in the photoresist 40 on a region where a N type diffusion layer 8 is to be formed. Then, ions of an N type impurity, for example, phosphorus (P) are implanted from the surface of the epitaxial layer 3 at an accelerating voltage of 90 to 160 (keV) and a dose of $1.0 \times 10^{14}$ to $1.0 \times 10^{16}$ (/cm$^2$). Subsequently, the photoresist 40 is removed, and then the N type diffusion layer 8 is formed by thermal diffusion.

At this time, the N type diffusion layer 8 is formed by self-alignment using the gate electrodes 12 and 13 as a mask. As described above, since the thickness of the tungsten silicon film 16 is approximately 2000 to 3000 (Å), it is possible to prevent ions of phosphorus (P) from being implanted into a region below the gate electrodes 12 and 13 exposed from the opening in the photoresist 40. In addition, the N type diffusion layer 8 is formed with a high positional accuracy with respect to the gate electrodes 12 and 13.

Figure 9:
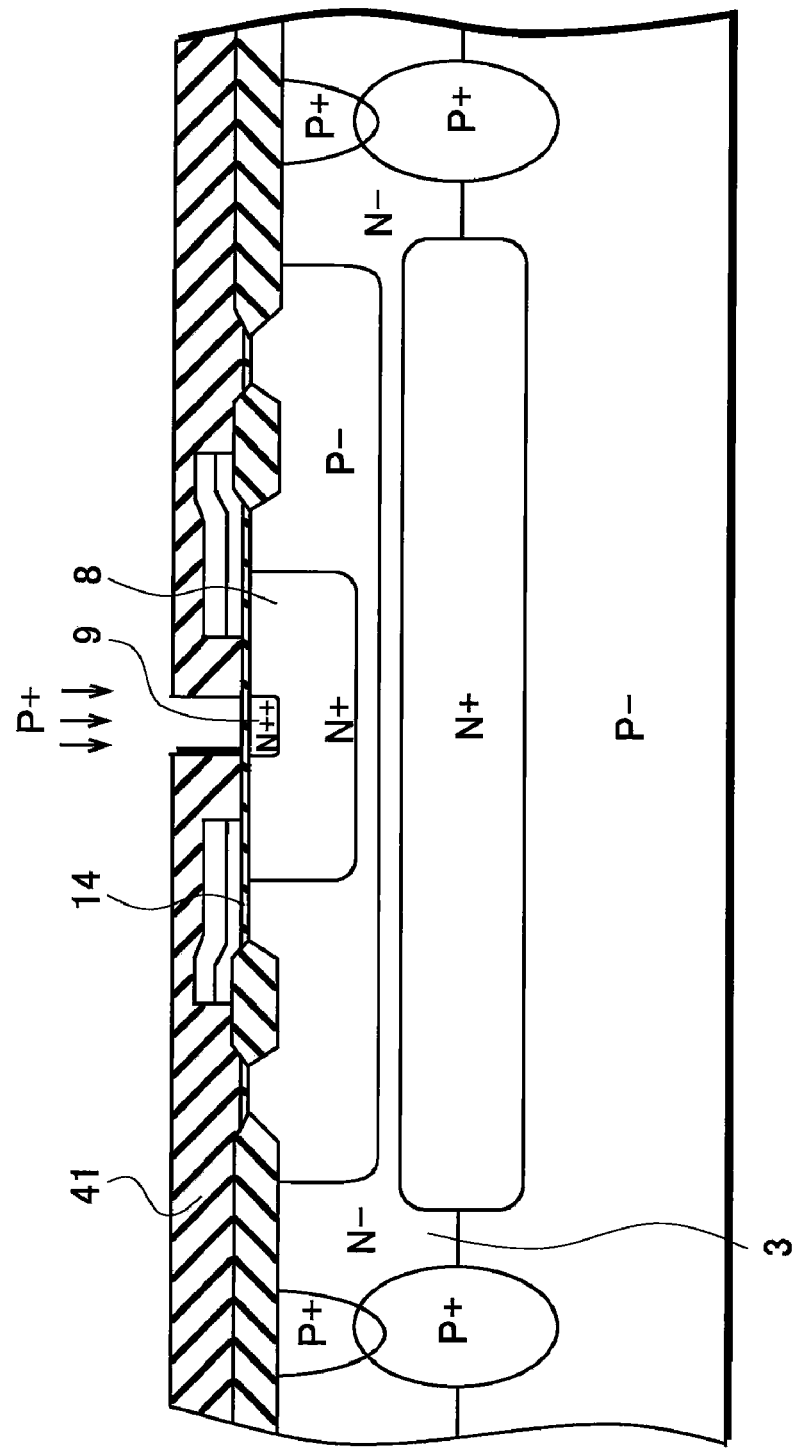
FIG. 9 is a cross-sectional view for describing the method of manufacturing a semiconductor device according to this preferred embodiment of the present invention.

Next, as shown in FIG. 9, a photoresist 41 is formed on the silicon oxide film to be used as the gate oxide film 14. By means of the known photolithography technique, an opening is formed in the photoresist 41 on a region where an N type diffusion layer 9 is to be formed. Then, ions of an N type impurity, for example, phosphorus (P) are implanted from the surface of the epitaxial layer 3 at an accelerating voltage of 90 to 110 (keV) and a dose of $1.0 \times 10^{14}$ to $1.0 \times 10^{16}$ (/cm$^2$). Subsequently, the photoresist 41 is removed, and then the N type diffusion layer 9 is formed by thermal diffusion.

Figure 10:
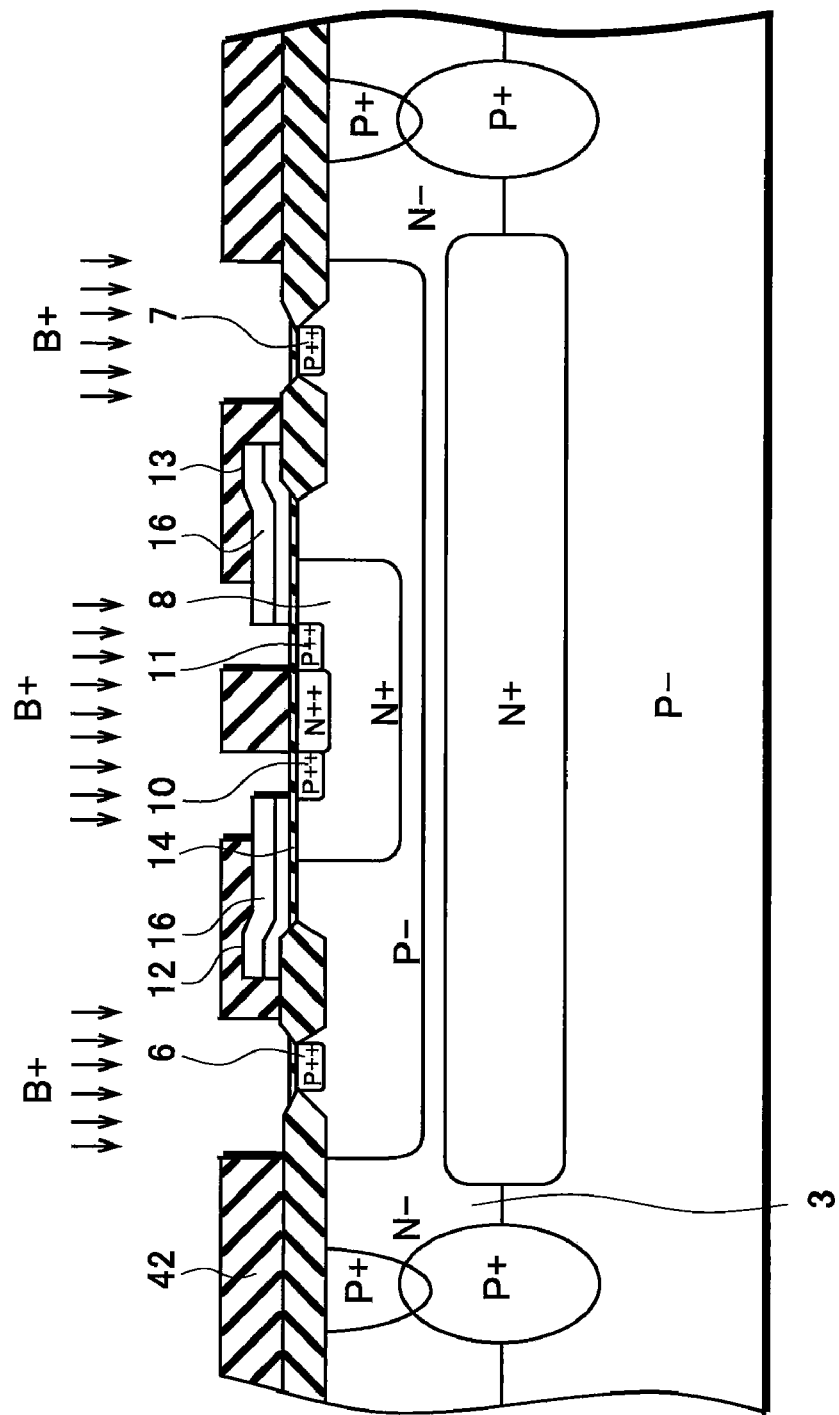
FIG. 10 is a cross-sectional view for describing the method of manufacturing a semiconductor device according to this preferred embodiment of the present invention.

Next, as shown in FIG. 10, a photoresist 42 is formed on the silicon oxide film to be used as the gate oxide film 14. By means of the known photolithography technique, openings are formed in the photoresist 42 on regions where P type diffusion layers 6, 7, 10 and 11 are to be formed. Then, ions of a P type impurity, for example, boron (B) are implanted from the surface of the epitaxial layer 3 at an accelerating voltage of 50 to 70 (keV) and a dose of $1.0 \times 10^{14}$ to $1.0 \times 10^{16}$ (/cm$^2$). Subsequently, the photoresist 42 is removed, and then the P type diffusion layers 6, 7, 10 and 11 are formed by thermal diffusion.

At this time, part of each of the P type diffusion layers 10 and 11, which part is positioned on a side facing a corresponding one of the P type diffusion layers 6 and 7, is formed by self-alignment using each of the gate electrodes 12 and 13 as a mask. As described above, since the thickness of the tungsten silicon film 16 is approximately 2000 to 3000 (Å), it is possible to prevent ions of boron (B) from being implanted into regions below the gate electrodes 12 and 13 exposed respectively from the openings in the photoresist 42. In addition, the P type diffusion layers 10 and 11 are formed with a high positional accuracy with respect to the gate electrodes 12 and 13.

By this manufacturing method, the N type diffusion layer 8 as a back gate region and P type diffusion layers 10 and 11 as source regions are formed with a high positional accuracy with respect to the gate electrodes 12 and 13. This manufacturing method makes it possible to improve a punch-through breakdown voltage between the drain and the source in the MOS transistor 1 due to the use of the N type diffusion layer 8 as the back gate region. Moreover, it is not necessary to take account of mask misalignment at the time of forming the N type diffusion layer 8 and P type diffusion layers 10 and 11, and these diffusion layers are formed with a high positional accuracy. As a result, it is possible to reduce the device size of the MOS transistor 1, and to reduce the on-resistance per area of the MOS transistor 1.

Figure 11:
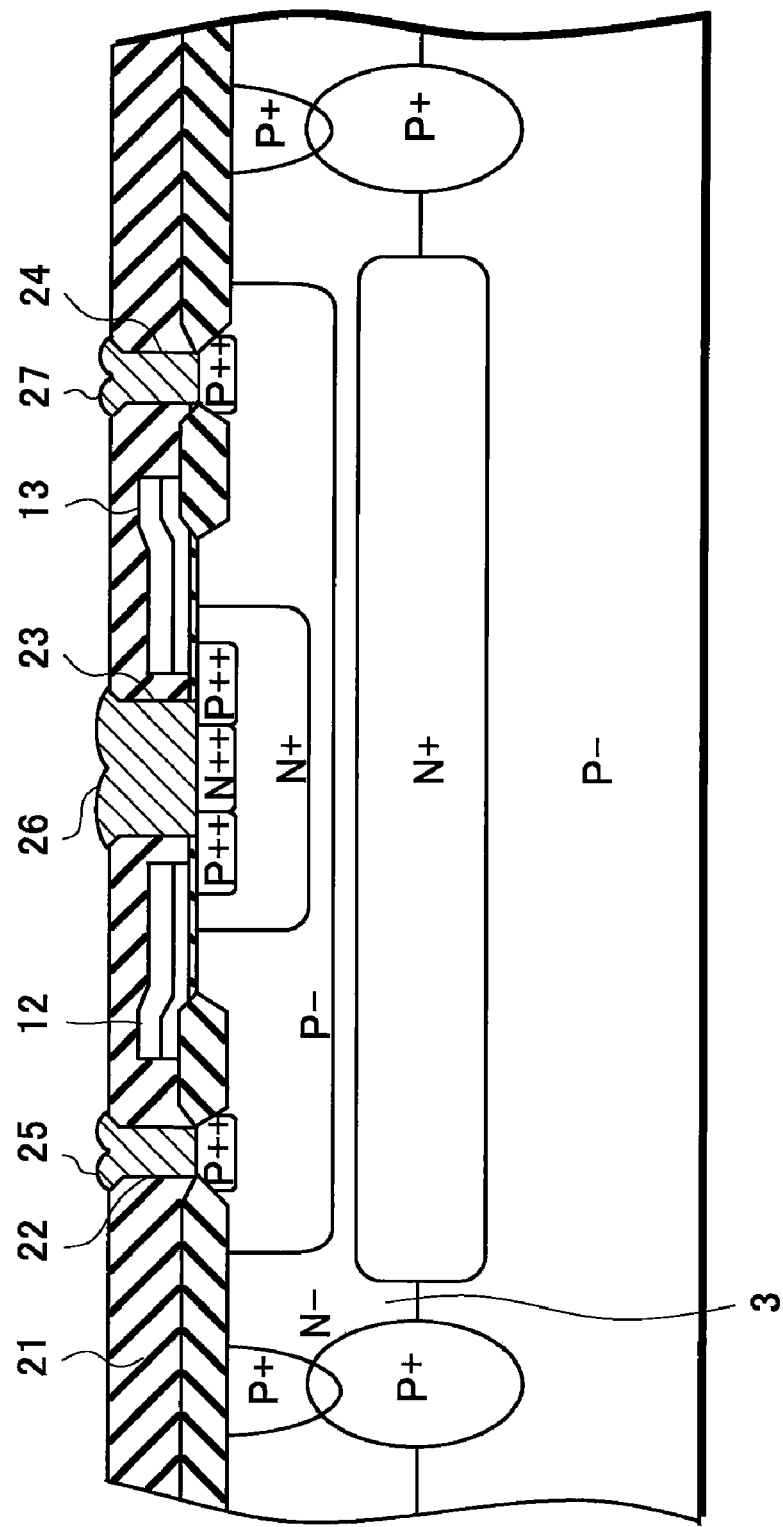
FIG. 11 is a cross-sectional view for describing the method of manufacturing a semiconductor device according to this preferred embodiment of the present invention.

Next, as shown in FIG. 11, for example, a BPSG (Boron Phospho Silicate Glass) film, a SOG (Spin On Glass) film or the like is deposited as an insulating layer 21 over the epitaxial layer 3. Then, by means of the known photolithography technique, contact holes 22, 23 and 24 are formed in the insulating layer 21 by dry etching using $CHF_3$ or $CF_4$ gas, for example. In each of the contact holes 22, 23 and 24, an aluminum alloy film made of, for example, an Al—Si film, an Al—Si—Cu film or an Al—Cu film is selectively formed, so that drain electrodes 25 and 27 and a source electrode 26 are formed respectively in the contact holes 22, 24 and 23.

Note that, in this embodiment, descriptions have been given of the case where each of the gate electrodes 12 and 13 is formed in a two-layer structure of the polysilicon film and the tungsten silicon film, but the preferred embodiment of the present invention is not limited to the above-described case. The gate electrode may be formed in a single-layer structure of a polysilicon film or a tungsten silicon film, for example. In this case, it is only necessary that the polysilicon film or the tungsten silicon film has a thickness enough to prevent implanted ions of phosphorus (P) and boron (B) from penetrating through the film. Moreover, various modifications are possible to be made on the preferred embodiment of the present invention without departing from the spirit of the preferred embodiment of the present invention. In the preferred embodiment of the present invention, the impurity concentration peak of the back gate region of the MOS transistor is formed in the deep portion of the semiconductor layer. In addition the impurity concentration of the back gate region positioned in the vicinity of the deep portion of the source region is high. This structure makes it possible to improve the punch-through breakdown voltage between the drain and source regions in the MOS transistor. As a result, a desired breakdown voltage characteristic is achieved.

In addition, in the preferred embodiment of the present invention, the gate electrode of the MOS transistor is formed in a lamination structure with the polysilicon film and the tungsten silicon film. This structure makes it possible to reduce the device size by forming the diffusion layer as the back gate region into a desired region. As a result, the on-resistance per area of the MOS transistor can be reduced.

Moreover, in the preferred embodiment of the present invention, when the back gate region is formed, the back gate region is formed into the deep portion of the semiconductor layer by self-alignment using the gate electrode. This manufacturing method makes it possible to form the impurity concentration peak of the back gate region in the deep portion of the semiconductor layer, and to improve the punch-through breakdown voltage between the drain and source regions in the MOS transistor due to the back gate region.

Furthermore, in the preferred embodiment of the present invention, when the back gate region is formed, the back gate region is formed into the deep portion of the semiconductor layer by self-alignment using the gate electrode. This manufacturing method makes it possible to form the back gate region in a desired region, and to reduce the device size. As a result, the on-resistance per area of the MOS transistor can be reduced.

Still furthermore, in the preferred embodiment of the present invention, the impurity concentration peak of the back gate region is formed in the deep portion of the semiconductor layer by self-alignment using the gate electrode. This manufacturing method makes it possible to improve the punch-through breakdown voltage between the drain and source regions in the MOS transistor due to the back gate region. As a result it is possible to reduce the number of manufacturing steps and the number of masks, and thereby to reduce the manufacturing cost.

What is claimed is:

1. A semiconductor device comprising:
   a semiconductor layer;
   a drain region, which is formed in the semiconductor layer;
   a source region, which is formed in the semiconductor layer;
   a back gate region, which is formed in the semiconductor layer;
   a gate oxide film formed on the semiconductor layer; and
   a gate electrode formed on the gate oxide film, wherein
   a first diffusion layer of one conductivity type is formed in the semiconductor layer so as to extend across regions where the drain region and the back gate region are formed,
   a diffusion layer of an opposite conductivity type constituting the back gate region is formed in the first diffusion layer of the one conductivity type,
   a second diffusion layer of the one conductivity type constituting the source region is formed in the diffusion layer of the opposite conductivity type, and
   an impurity concentration peak of the diffusion layer of the opposite conductivity type is formed in a deeper portion of the first diffusion layer of the one conductivity type than a junction region between the diffusion layer of the opposite conductivity type and the second diffusion layer of the one conductivity type.

2. The semiconductor device according to claim 1 wherein, an impurity concentration in a vicinity of a bottom surface of the second diffusion layer of the one conductivity type is 0.8 times or more as high as that in a vicinity of a top surface of the second diffusion layer of the one conductivity type among impurity concentrations of the diffusion layer of the opposite conductivity type in a vicinity of the junction region.

3. The semiconductor device according to claim 1 wherein the gate electrode is formed of a polysilicon film and a tungsten silicon film, and
   the tungsten silicon film has a thickness greater than that of the polysilicon film.

4. A method of manufacturing a semiconductor device, comprising the steps of:
   forming a first diffusion layer of one conductivity type in a semiconductor layer, and forming a gate oxide film and a gate electrode on the semiconductor layer, and then forming a diffusion layer of an opposite conductivity type constituting a back gate region in the first diffusion layer of the one conductivity type by self-alignment using the gate electrode; and
   forming a second diffusion layer of the one conductivity type constituting a source region in the diffusion layer of the opposite conductivity type in a manner that the second diffusion layer of the one conductivity type overlapping the diffusion layer of the opposite conductivity type, and forming a third diffusion layer of the one conductivity type constituting a drain region in the first diffusion layer of the one conductivity type; wherein,
   in the step of forming the diffusion layer of the opposite conductivity type, an impurity concentration peak of the diffusion layer of the opposite conductivity type is formed in a portion of the first diffusion layer of the one conductivity type deeper than a junction region between the diffusion layer of the opposite conductivity type and the second diffusion layer of the one conductivity type.

5. The method of manufacturing a semiconductor device according to claim 4, wherein the step of forming the diffusion layer of the opposite conductivity type includes the step of performing ion implantation at an accelerating voltage of 80 to 160 (KeV).

6. The method of manufacturing a semiconductor device according to claim 4, wherein, in the step of forming the gate electrode, a tungsten silicon film is deposited on a polysilicon film in a manner that the tungsten silicon film has a thickness greater than that of the polysilicon film.

* * * * *